United States Patent
Buck et al.

(10) Patent No.: US 9,348,962 B2
(45) Date of Patent: May 24, 2016

(54) HIERARCHICAL DESIGN OF INTEGRATED CIRCUITS WITH MULTI-PATTERNING REQUIREMENTS

(71) Applicant: INTERNATIONAL BUSINESS MACHINES CORPORATION, Armonk, NY (US)

(72) Inventors: Nathan Buck, Underhill, VT (US); Brian Dreibelbis, Underhill, VT (US); John P. Dubuque, Jericho, VT (US); Eric A. Foreman, Fairfax, VT (US); David J. Hathaway, Underhill, VT (US); Jeffrey G. Hemmett, St. George, VT (US); Natesan Venkateswaran, Hopewell Junction, NY (US); Chandramouli Visweswariah, Croton-on-Hudson, NY (US); Vladimir Zolotov, Putnam Valley, NY (US)

(73) Assignee: GLOBALFOUNDRIES INC., Grand Cayman (KY)

(*) Notice: Subject to any disclaimer, the term of this patent is extended or adjusted under 35 U.S.C. 154(b) by 0 days.

(21) Appl. No.: 14/463,025

(22) Filed: Aug. 19, 2014

(65) Prior Publication Data
US 2014/0359547 A1 Dec. 4, 2014

Related U.S. Application Data

(62) Division of application No. 13/665,276, filed on Oct. 31, 2012, now Pat. No. 8,850,378.

(51) Int. Cl.
*G06F 17/50* (2006.01)

(52) U.S. Cl.
CPC ........ *G06F 17/5072* (2013.01); *G06F 17/5009* (2013.01); *G06F 17/5068* (2013.01); *G06F 17/5081* (2013.01)

(58) Field of Classification Search
CPC ............ G06F 17/5072; G06F 17/5068; G06F 17/5077; G06F 17/5081; G06F 17/505; G06F 2217/12; G03F 1/144; G03F 1/36; H01L 22/20; H01L 27/0207
USPC .............................................. 716/54, 55, 122
See application file for complete search history.

(56) References Cited

U.S. PATENT DOCUMENTS

| | | | |
|---|---|---|---|
| 6,880,138 | B1 | 4/2005 | Teig et al. |
| 7,475,377 | B2 | 1/2009 | Yamada |

(Continued)

OTHER PUBLICATIONS

Notice of Allowance dated Sep. 22, 2014 in related U.S. Appl. No. 14/139,004, 10 pages.

(Continued)

*Primary Examiner* — Vuthe Siek
(74) *Attorney, Agent, or Firm* — David Cain; Andrew M. Calderon; Roberts Mlotkowski Safran & Cole, P.C.

(57) ABSTRACT

Systems and methods for avoiding restrictions on cell placement in a hierarchical design of integrated circuits with multi-patterning requirements are described. The method may be provided implemented in a computer infrastructure having computer executable code tangibly embodied on a computer readable storage medium having programming instructions operable to assign a color to each pattern shape in a first cell, assign a color to each pattern shape in a second cell, characterize quantities of interest for each pattern shape in the first cell, determine that the colors assigned in the first cell are all one to one mappable to the colors assigned in the second cells, characterize quantities of interest for each pattern shape in the second cell using the quantities of interest characterized for the first cell, and model the quantities of interest for the first cell and the second cell.

13 Claims, 11 Drawing Sheets

(56) References Cited

U.S. PATENT DOCUMENTS

| | | | |
|---|---|---|---|
| 8,019,458 | B2 | 9/2011 | Funk et al. |
| 8,069,423 | B2 | 11/2011 | Ghan et al. |
| 8,180,621 | B2 | 5/2012 | Phillips |
| 8,239,798 | B1 | 8/2012 | Goyal et al. |
| 2002/0156609 | A1 | 10/2002 | Hirata et al. |
| 2004/0058255 | A1 | 3/2004 | Jessen et al. |
| 2007/0061771 | A1 | 3/2007 | Habitz et al. |
| 2011/0139982 | A1 | 6/2011 | Kijima et al. |
| 2012/0035878 | A1 | 2/2012 | Phatak |
| 2013/0094035 | A1* | 4/2013 | Chang ............... G03F 1/68 358/1.9 |

OTHER PUBLICATIONS

Office Action dated Oct. 6, 2014 in related U.S. Appl. No. 14/39,023, 6 pages.

Office Action dated Mar. 16, 2015 in related U.S. Appl. No. 14/139,023, 5 pages.

Jeong et al., Assessing Chip-Level Impact of Double Patterning Lithography, 2010, IEEE, pp. 122-130.

Jeong et al., A Framework for Chip-Level Evaluation of Misaligment and Linewidth Error Impacts Across Double-Patterning Technology otion, 2010, pp. 1-8.

Ausschniti, C.P., "Multi-Patterning Overlay Control", SPIE Digital Library vol. 6924, 2008, 5 pages.

Unknown, "Comprehensive Multi-Patterning Support: Calibre Multi-Patterning", www.mentor.com, 2011, 3 pages.

Englard et al., "Accurate In-Resolution Level Overlay Metrology for Multi-Patterning Lithography Techniques", SPIE Digital Library vol. 6922, 2008, 9 pages.

Jeong et al., "Timing Analysis and Optimization Implications of Bimodal CD Distribution in Double Patterning Lithography", IEEE, 2009, pp. 486-491.

Poutous et al., "Correlation of Fabrication Tolerances with the Performance of Guided-Mode-Resonance Micro-optical Components", Proc. of SPIE vol. 7205, 2009, 9 pages.

Kahng, "The Future of Signoff", TAU 2011 Keynote, UCSD VLSI CAD Laboratory, 2011, 52 pages.

Notice of Allowance dated Mar. 31, 2016 in related U.S. Appl. No. 14/552,782, 9 pages.

* cited by examiner

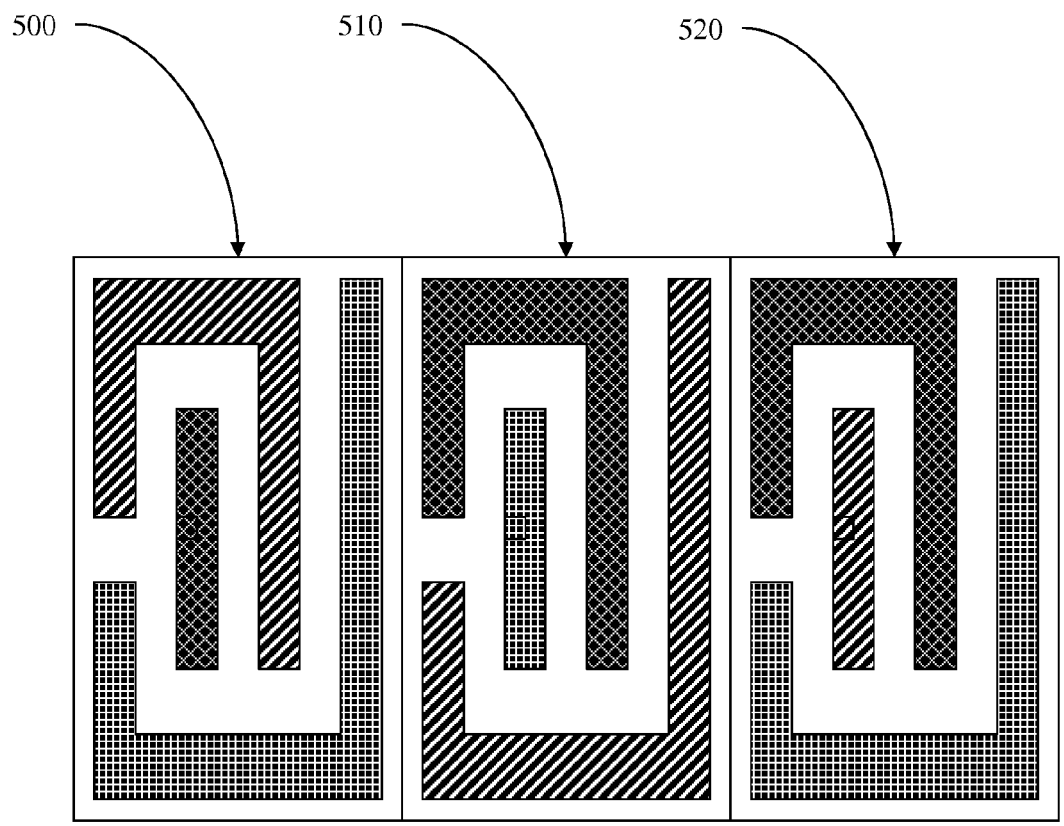
 X
   Y
 Z

HIERARCHICAL DESIGN OF INTEGRATED CIRCUITS WITH MULTI-PATTERNING REQUIREMENTS

FIELD OF THE INVENTION

The invention relates to systems and methods for integrated circuit ("IC") fabrication and optimization and, more particularly, to systems and methods for avoiding restrictions on cell placement in a hierarchical design of integrated circuits with multi-patterning requirements.

BACKGROUND

An IC is a device (e.g., a semiconductor device) or electronic system that includes many electronic components, such as transistors, resistors, diodes, etc. These components are often interconnected to form multiple circuit components, such as gates, cells, memory units, arithmetic units, controllers, decoders, etc. An IC includes multiple layers of wiring that interconnect its electronic and circuit components.

Design engineers design ICs by transforming logical or circuit descriptions of the ICs' components into geometric descriptions, called design layouts. IC design layouts typically include circuit modules (e.g., geometric representations of electronic or circuit IC components) with pins, and interconnect lines (e.g., geometric representations of wiring) that connect the pins of the circuit modules. A net is typically defined as a collection of pins that need to be connected. In this fashion, design layouts often describe the behavioral, architectural, functional, and structural attributes of the IC. To create the design layouts, design engineers typically use electronic design automation ("EDA") applications. These applications provide sets of computer-based tools for creating, editing, analyzing, and verifying design layouts.

Large IC designs are often designed by design engineers using a hierarchical design methodology, in which cells are pre-designed and pre-characterized. A standard cell is a group of transistor and interconnect structures that provides a boolean logic function (e.g., AND, OR, XOR, XNOR, inverters) or a storage function (flipflop or latch). However, higher level cells may be complete microprocessors or memory arrays. The cells are then placed and interconnected within the design of the IC or of higher level cells. The cells may be designed for reuse many times in many different ICs, or may be designed for a single use before their exact placement and surrounding cells and wires are known. Therefore, it is desirable to avoid any restrictions in their layout or characterization that would restrict the locations in which they may be placed or the patterning of shapes in the cells and wires that may surround them.

Accordingly, there exists a need in the art to overcome the deficiencies and limitations described hereinabove.

SUMMARY

In a first aspect of the invention, a method is provided implemented in a computer infrastructure having computer executable code tangibly embodied on a computer readable storage medium having programming instructions operable to assign a color to each pattern shape in a first cell. The programming instructions further operable to assign a color to each pattern shape in a second cell. The programming instructions further operable to characterize quantities of interest for each pattern shape in the first cell. The programming instructions further operable to determine that the colors assigned in the first cell are all one to one mappable to the colors assigned in the second cells. The programming instructions further operable to characterize quantities of interest for each pattern shape in the second cell using the quantities of interest characterized for the first cell. The programming instructions further operable to model the quantities of interest for the first cell and the second cell.

In another aspect of the invention, a method is provided for hierarchical design of an integrated circuit design. The method comprises assigning a color to each pattern shape in a first cell. The method further comprises assigning a color to each pattern shape in a second cell. The method also comprises characterizing quantities of interest for each pattern shape in the first cell. The method further comprises determining that the colors assigned in the first cell are not all one to one mappable to the colors assigned in the second cells. The method further comprises characterizing quantities of interest for each pattern shape in the second cell using the quantities of interest determined for each one to one mappable group. The method further comprises modeling the quantities of interest for the first cell and the second cell using a processor.

In another aspect of the invention, a method is provided for hierarchical design of an integrated circuit design. The method comprises assigning a color to each pattern shape in a first cell. The method further comprises assigning a color to each pattern shape in a second cell. The method also comprises characterizing quantities of interest for each pattern shape in the first cell. The method further comprises determining that the colors assigned in the first cell are not all one to one mappable to the colors assigned in the second cells. The method further comprises creating a coloring of the first cell and the second cell by assigning at least one additional color to the first cell or the second cell, the at least one additional color being different from the colors originally assigned to the first cell and the second cell, and the coloring is created such that each of the colors assigned to the first cell are one to one mappable or many to one mappable with the colors assigned to the second cell. The method further comprises characterizing quantities of interest for each pattern shape in the second cell using the quantities of interest determined for each one to one mappable group. The method further comprises modeling the quantities of interest for the first cell and the second cell using a processor.

BRIEF DESCRIPTION OF THE SEVERAL VIEWS OF THE DRAWINGS

The present invention is described in the detailed description, which follows, in reference to the noted plurality of drawings by way of non-limiting examples of exemplary embodiments of the present invention.

DETAILED DESCRIPTION

Figure 1:
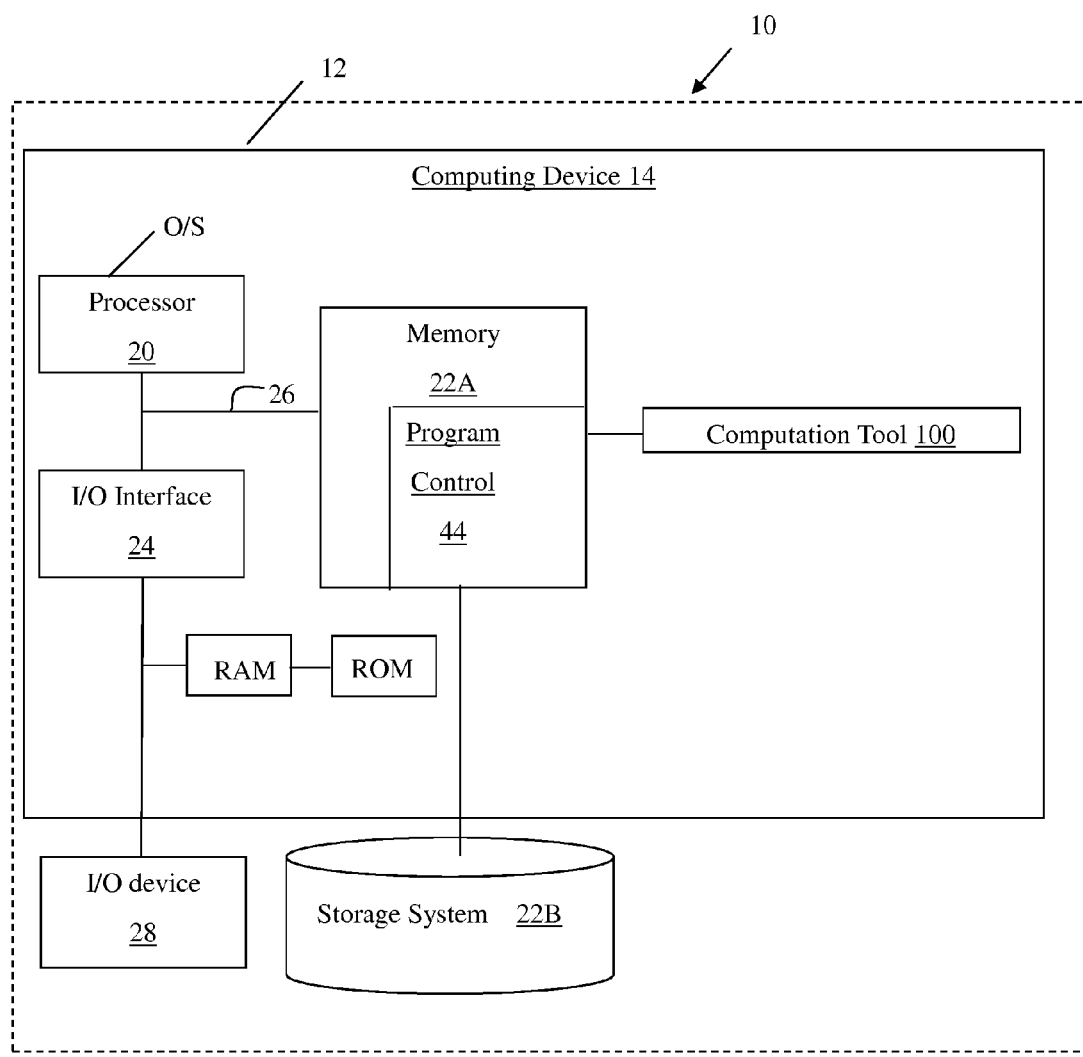
FIG. 1 is an illustrative external environment for implementing the invention in accordance with aspects of the invention.

The invention relates to systems and methods for avoiding restrictions on cell placement in a hierarchical design of ICs with multi-patterning requirements. More specifically, implementations of the invention provide systems and methods for modeling quantities of interest in an IC as a function of parameters associated with shapes assigned different colors of a multi-patterned design. In embodiments, it is possible to characterize the quantities of interest of a cell once, and reuse the characterization for all instances of the cell for which there is a one to one mapping of the characterization colors to the instance colors. In additional embodiments, some cells may be colorable with colorings that cannot be one to one mapped to each other. In these embodiments, the cells may be handled by characterizing quantities of interest for one coloring of each one to one mappable group. Alternatively, a coloring may be created using more than the original set of colors that is many to one mappable to each possible coloring of the cell.

Advantageously, in embodiments, the systems and methods of the present invention allow for simple models of quantities of interest in an IC to be generated. Also advantageously, in embodiments, the systems and methods of the present invention avoid restrictions on cell placement in a hierarchical design of ICs with multi-patterning requirements.

System Environment

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

FIG. 1 shows an illustrative environment 10 for managing the processes in accordance with the invention. To this extent, the environment 10 includes a server or other computing system 12 that can perform the processes described herein. In particular, the server 12 includes a computing device 14. The computing device 14 can be resident on a network infrastructure or computing device of a third party service provider (any of which is generally represented in FIG. 1).

The computing device 14 also includes a processor 20, memory 22A, an I/O interface 24, and a bus 26. The memory 22A can include local memory employed during actual execution of program code, bulk storage, and cache memories which provide temporary storage of at least some program code in order to reduce the number of times code must be retrieved from bulk storage during execution. In addition, the computing device includes random access memory (RAM), a read-only memory (ROM), and an operating system (O/S).

The computing device 14 is in communication with an external I/O device/resource 28 and a storage system 22B. For example, the I/O device 28 can comprise any device that enables an individual to interact with the computing device 14 (e.g., user interface) or any device that enables the computing device 14 to communicate with one or more other computing devices using any type of communications link. The external I/O device/resource 28 may be for example, a handheld device, PDA, handset, keyboard etc.

In general, the processor 20 executes computer program code (e.g., program control 44), which can be stored in the memory 22A and/or storage system 22B. Moreover, in accordance with aspects of the invention, the program control 44 controls a computation tool 100, e.g., at least a portion of an EDA application, which performs the processes described herein. The computation tool 100 can be implemented as one or more program code in the program control 44 stored in memory 22A as separate or combined modules. Additionally, the computation tool 100 may be implemented as separate dedicated processors or a single or several processors to provide the function of these tools.

In embodiments, the computation tool 100 may be configured to assign a color to each pattern shape in at least a first cell, assign a color to each pattern shape in at least a second cell, and characterize quantities of interest for each pattern shape in the first cell. The computation tool 100 may further be configured to determine that the colors assigned in the first cell are all one to one mappable to the colors assigned in the second cell. When there is a one to one mapping, the computing device may further be configured to characterize quantities of interest for each pattern shape in the second cell using the quantities of interest characterized for the first cell. The computation tool 100 is then configured to model the quantities of interest for the first cell and the second cell.

In additional embodiments, the computation tool 100 may be further configured to determine that the colors assigned in the first cell are not all one to one mappable to the colors assigned in the second cells. When cells are not all one to one mappable, the computing device may further be configured to characterize quantities of interest for each pattern shape in the second cell using the quantities of interest determined for each one to one mappable group. The computation tool 100 is then configured to model the quantities of interest for the first cell and the second cell.

While executing the computer program code, the processor 20 can read and/or write data to/from memory 22A, storage system 22B, and/or I/O interface 24. The program code executes the processes of the invention. The bus 26 provides a communications link between each of the components in the computing device 14.

The computing device 14 can comprise any general purpose computing article of manufacture capable of executing computer program code installed thereon (e.g., a personal computer, server, etc.). However, it is understood that the computing device 14 is only representative of various possible equivalent-computing devices that may perform the processes described herein. To this extent, in embodiments, the functionality provided by the computing device 14 can be implemented by a computing article of manufacture that includes any combination of general and/or specific purpose hardware and/or computer program code. In each embodiment, the program code and hardware can be created using standard programming and engineering techniques, respectively.

Similarly, the computing infrastructure 12 is only illustrative of various types of computer infrastructures for implementing the invention. For example, in embodiments, the server 12 comprises two or more computing devices (e.g., a server cluster) that communicate over any type of communications link, such as a network, a shared memory, or the like, to perform the process described herein. Further, while performing the processes described herein, one or more computing devices on the server 12 can communicate with one or more other computing devices external to the server 12 using any type of communications link. The communications link can comprise any combination of wired and/or wireless links; any combination of one or more types of networks (e.g., the Internet, a wide area network, a local area network, a virtual private network, etc.); and/or utilize any combination of transmission techniques and protocols.

Coloring of Multi-Patterning in Cells

Figure 2A:
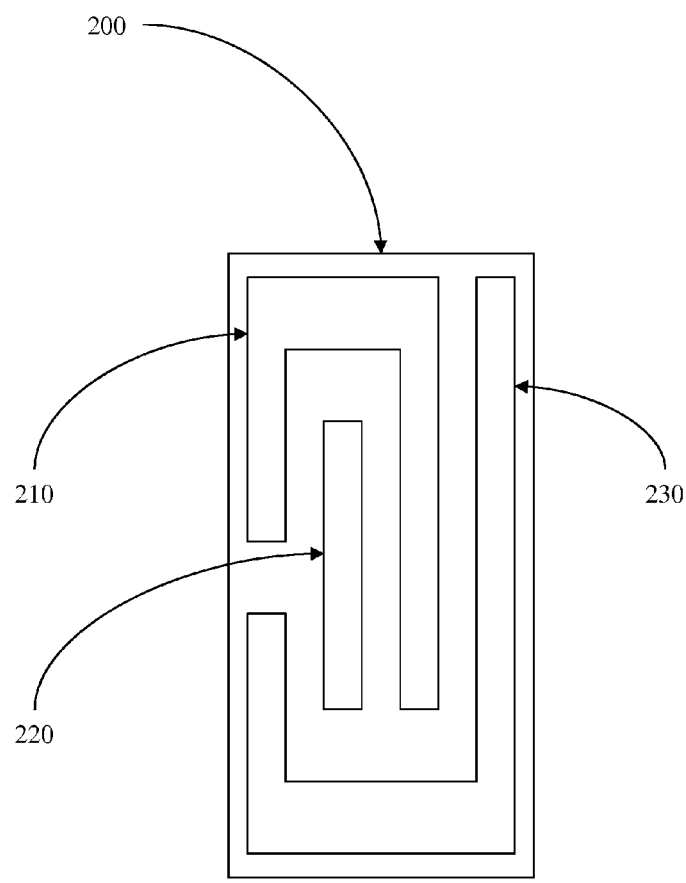
FIGS. 2a, 2b, and 3-7 illustrate coloring of multi-patterning in cells in accordance with aspects of the invention.
Figure 2B:

As discussed above, large integrated circuit designs are often designed using a hierarchical design methodology, in which cells are pre-designed and pre-characterized. These cells are then placed and interconnected within the design of the integrated circuit or of higher level cells, and may range from simple gates such as inverters or NAND gates to complete microprocessors or memory arrays. Cell 200 in FIG. 2a is an example of such a cell in a technology that uses a multi-patterning process (e.g., a triple patterning process), and geometric shapes 210, 220, and 230 (e.g., geometric representations of electronic or circuit IC components) are shapes within cell 200 that are subject to triple-patterning requirements. The three colors that may be used to represent the triple patterning are X, Y, and Z, represented by the corresponding shape shading in FIG. 2b. For purposes of illustration and not limitation, the terms "color" and "coloring," and the like, have been chosen as a means for representing a distinction between each patterning. However, one of skill in the art should understand that any indicator may be chosen in accordance with aspects of the invention to accurately maintain a distinction between each patterning.

Figure 3:
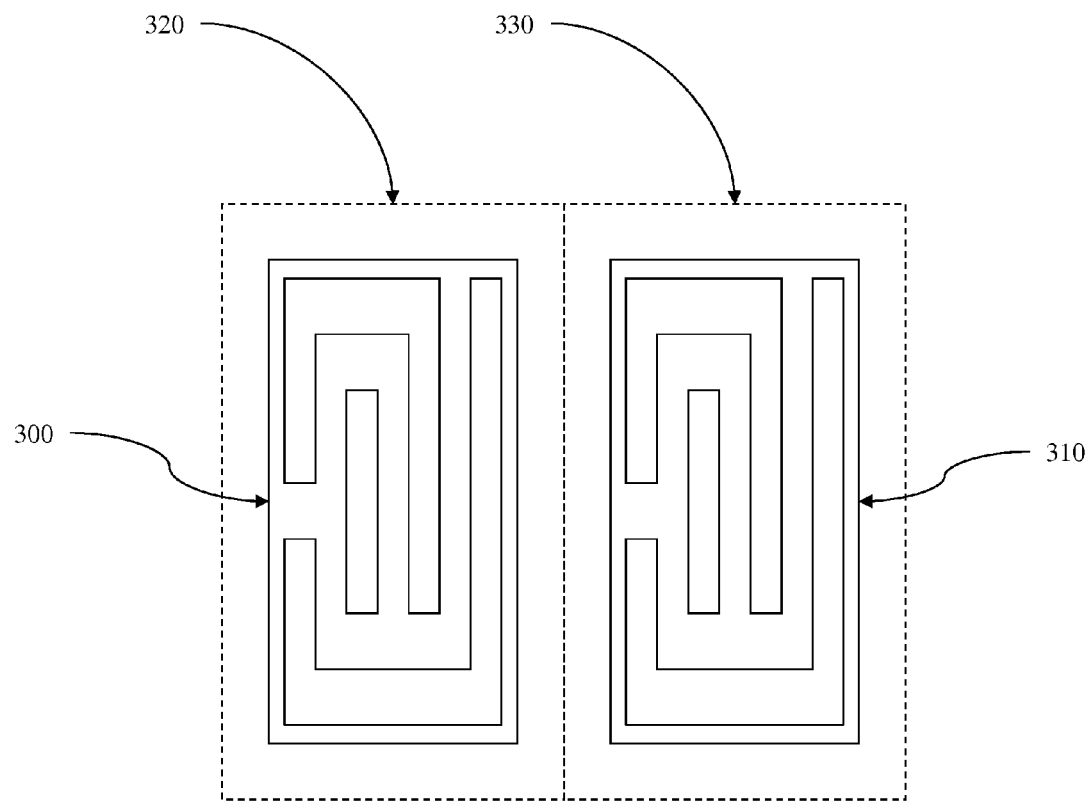

Cells may be designed for reuse many times in many different integrated circuits, or may be designed for a single use before their exact placement and surrounding cells and wires are known. Therefore, it is desirable to avoid any restrictions in the layout of the cells or characterization that would restrict the locations in which the cells may be placed or the coloring of shapes in the cells and wires that may surround them. These restrictions may be avoided by providing sufficient spacing between perimeters of the cell and shapes in the cell and/or shapes of surrounding cells and wires, but this may result in wasted area in the IC. FIG. 3 illustrates such a spacing of instances 300 and 310 of cell 200 (as shown in FIG. 2a), with widened borders 320 and 330, respectively, to ensure no coloring interaction between the instances.

Figure 4:
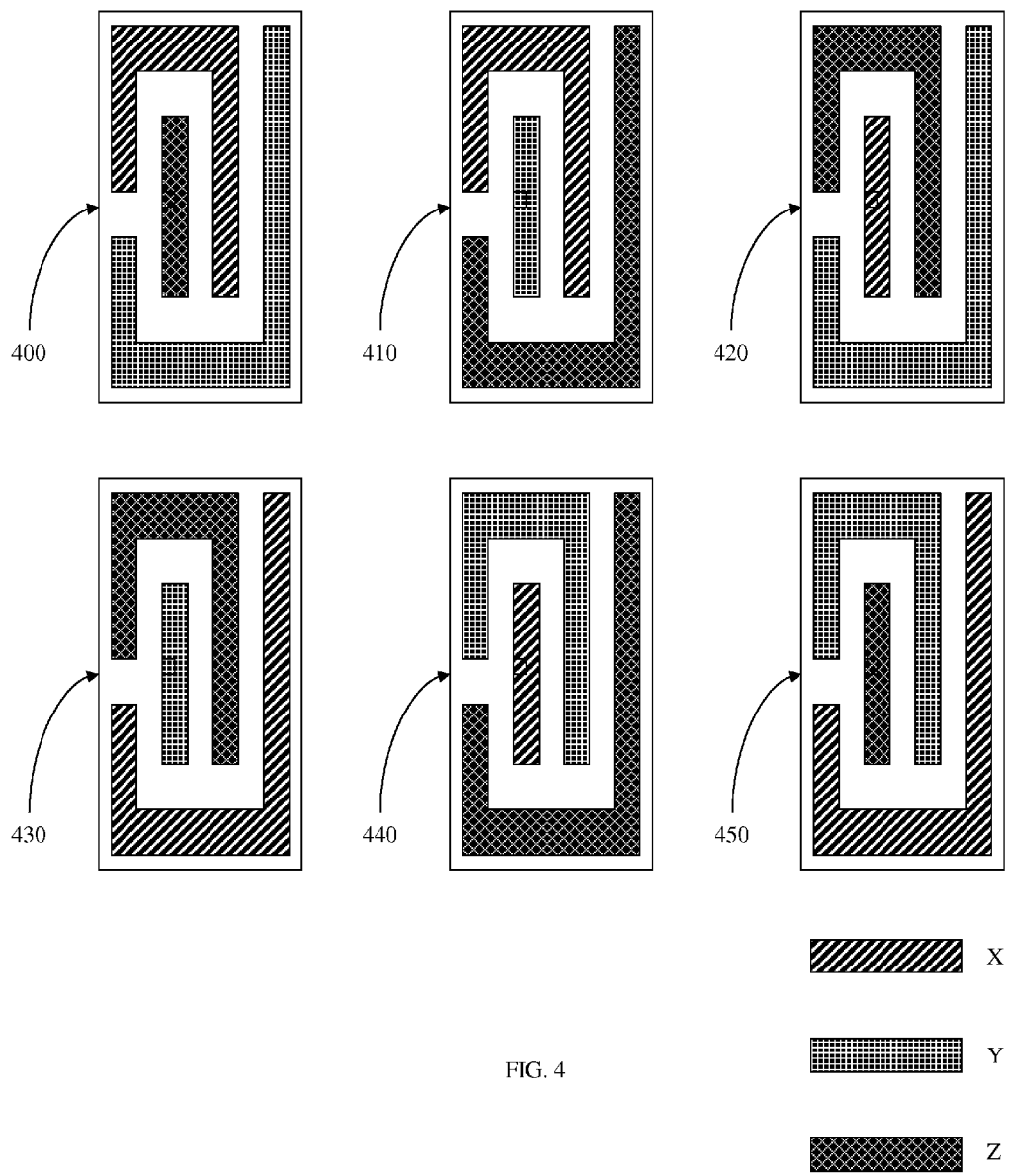
Figure 5:

Therefore, a typical approach to avoiding restrictions on the placement or coloring of surrounding cells without using spacing is to defer coloring the shapes of the cell until the surrounding cells and wires of an instance of the cell are known. This means that a single cell may have multiple different colorings. These colorings 400 through 450 of cell 200 (as shown in FIG. 2a) are shown in FIG. 4. FIG. 5 shows tightly packed instances 500, 510, and 520 of cell 200 (as shown in FIG. 2a) with respective colorings 400, 430, and 420 (shown in FIG. 4).

In embodiments, implementations of the invention provide systems and methods for modeling quantities of interest (e.g., delays) in an IC as a function of parameters associated with shapes assigned to different colors of a multi-patterned design. Such functions may include, but are not limited to, linear functions of these parameters. For example, a first set of parameters $p_{Xw}$, $p_{Yw}$, and $p_{Zw}$ for respective colors X, Y, and Z of FIG. 2b may represent the variation in the manufactured width of shapes of the respective colors, where a positive value of a parameter models a wire of the associated color that is wider than nominal, and a negative value of a parameter models a wire of the associated color that is narrower than nominal. A second set of parameters $p_{Xa}$, $p_{Ya}$, and $p_{Za}$ for respective colors X, Y, and Z of FIG. 2b may represent the horizontal misalignment of shapes of the respective colors, where a positive value of a parameter models a wire of the associated color that is misaligned to the right of its nominal position, and a negative value of a parameter models a wire of the associated color that is misaligned to the left of its nominal position. Variational parameters are typically dimensionless parameters normalized so that a value of zero represents the nominal value for the varying quantity, a value of 1 represents variation in the positive direction of one standard deviation, and a value of −1 represents variation in the negative direction of one standard deviation. It should be understood by those of skill in the art that other interpretations for variational parameters may be used, including unnormalized values.

A delay of cell 200 (as shown in FIG. 2a) that increases with a capacitance between shapes 210 and 230 in an instance of the cell manufactured using coloring 400 might then be computed with a function (1):

$$D_{400}=D_0+D_1 \cdot p_{Xw}+D_2 \cdot p_{Xa}+D_3 \cdot p_{Yw}+D_4 \cdot p_{Ya} \quad (1)$$

Where $D_0$ is the delay when all shapes widths and alignments are nominal, $D_1$ is the increase in delay when shapes of color X are one standard deviation wider than nominal, $D_2$ is the increase in delay when shapes of color X are one standard deviation to the right of their nominal position, $D_3$ is the increase in delay when shapes of color Y are one standard deviation wider than nominal, and $D_4$ is the increase in delay when shapes of color Y are one standard deviation to the right of their nominal position. Since no shapes of color Z are involved in the capacitance of interest, parameters $p_{Zw}$ and $p_{Za}$ do not appear in the delay function.

It should be appreciated by those of skill in the art that actual circuit delays are functions of multiple capacitances and many other parameters such as resistances, output loading, and input slews, and include some parameters that will vary between instances of a cell with the same coloring. The $D_i$ values in the illustrative example may themselves be functions of these other parameters. However, these other dependencies are omitted for illustrative purposes. The $D_i$ values or functions can be determined using well-known methods such as finite differencing or derivative chain ruling.

Capacitance between a pair of adjacent shapes will increase with the width of either involved shape due to the consequent narrowing of the space between them, and will increase misalignments that bring the shapes closer together. In the illustrative example of a delay dependent only on a capacitance between shapes 210 and 230 (as shown in FIG. 2a), the capacitance will increase with an increase in width of either shape, and will increase with positive (rightward) misalignment of shape 210 or negative (leftward) misalignment of shape 230. If, as is typically the case, the delay increases with increasing capacitance, $D_1$, $D_2$, and $D_3$, will be positive and $D_4$ will be negative.

It should be appreciated by those skilled in the art that the delay function for different colorings of cell 200 (as shown in FIG. 2a) might have different coefficients for the variational parameters. Therefore, it may be possible to separately compute delay functions for all colorings of cell 200, but this may result in an undesirable increase in the cost (run time and model storage) of characterization.

However, in many multi-patterning approaches, the same methods are used to produce shapes of each color. Consequently, the statistical distributions of the variational parameters of the colors are the same. In embodiments, it is possible to characterize the quantities of interest (e.g., delays and slews) of a cell once and reuse that characterization for all instances of the cell for which there is a one to one mapping of the characterization colors to the instance colors. For example, since all shapes of color X in coloring 400 (as shown in FIG. 4) have the color Y in coloring 440, all shapes of the color Y in coloring 400 have the color Z in coloring 440, and all shapes of the color Z in coloring 400 have the color X in coloring 440, the delay for an instance of cell 200 (as shown in FIG. 2a) using coloring 440 could be computed using the same $D_0$, $D_1$, $D_2$, $D_3$, and $D_4$ values found in the characterization of coloring 400, with delay function (2):

$$D_{440}=D_0+D_1 \cdot p_{Yw}+D_2 \cdot p_{Ya}+D_3 \cdot p_{Zw}+D_4 \cdot p_{Za} \quad (2)$$

Where each coefficient previously multiplied by a $p_X$ parameter is instead multiplied by a $p_Y$ parameter, and each coefficient previously multiplied by a $p_Y$ parameter is instead multiplied by a $p_Z$ parameter.

If a delay path goes through instances 500, 510, and 520 of FIG. 5, the delays through each cell may be computed using function (3):

$$D_{500}=D_0+D_1 \cdot p_{Xw}+D_2 \cdot p_{Xa}+D_3 \cdot p_{Yw}+D_4 \cdot p_{Ya}$$

$$D_{510}=D_0+D_1 \cdot p_{Zw}+D_2 \cdot p_{Za}+D_3 \cdot p_{Xw}+D_4 \cdot p_{Xa}$$

$$D_{520}=D_0+D_1 \cdot p_{Zw}+D_2 \cdot p_{Za}+D_3 \cdot p_{Yw}+D_4 \cdot p_{Ya} \quad (3)$$

Accordingly, the delay of a though cells 500, 510, and 520 may be computed using function (4):

$$D_{path}=D_0+(D_1+D_3) \cdot p_{Xw}+2D_3 \cdot p_{Yw}+2D_1 \cdot p_{Zw}+(D_2+D_4) \cdot p_{Xa}+2D_4 \cdot p_{Ya}+2D_2 \cdot p_{Za} \quad (4)$$

Since $D_2$ will be positive and $D_4$ will be negative, the sensitivity of the path delay to misalignment of the color X will be reduced relative to the sum of the absolute values of the sensitivities of the delays comprising the path.

Figure 6:
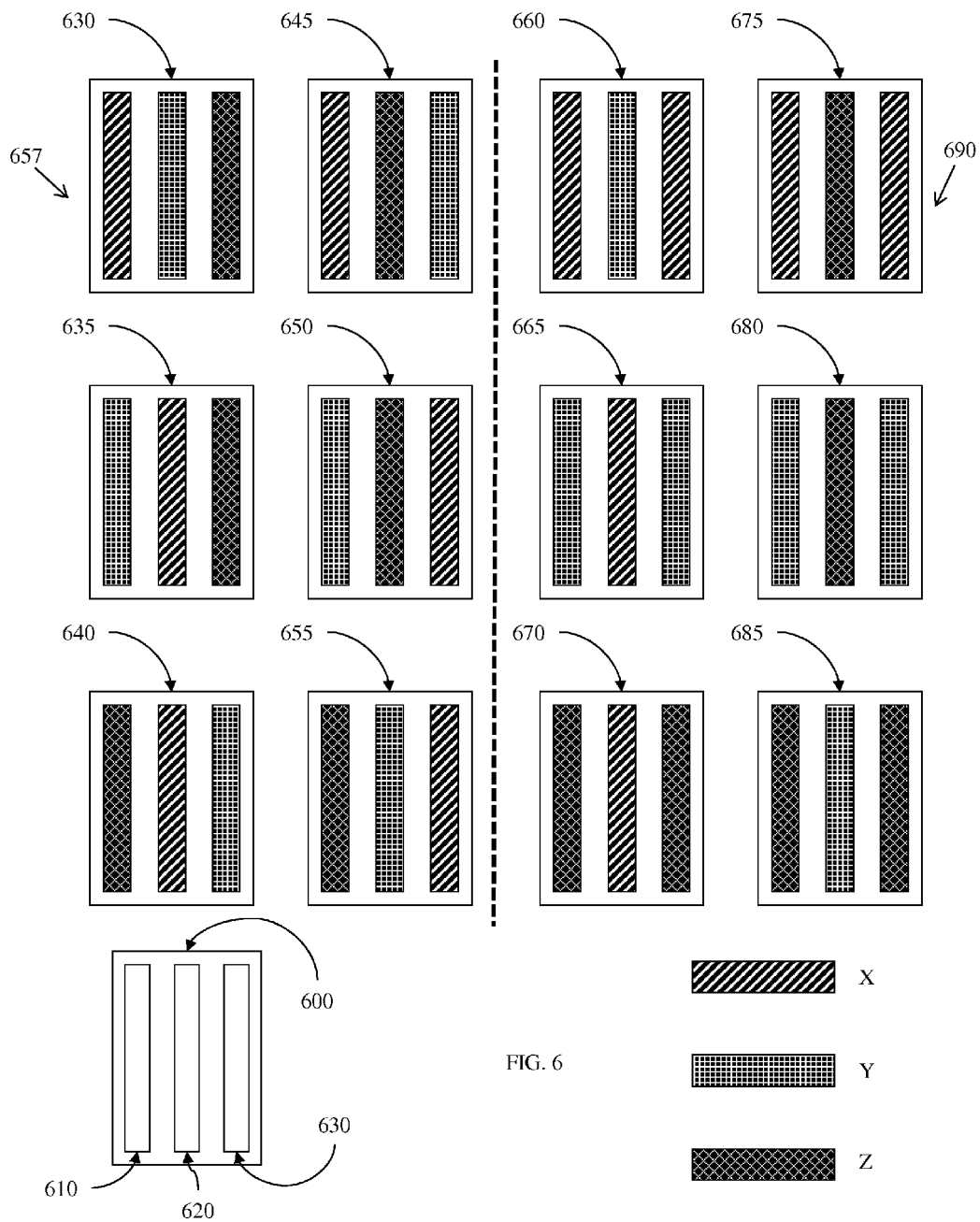

In additional embodiments, some cells may be colorable with colorings that cannot be one to one mapped to each other. Instance 600 in FIG. 6 shows such a cell containing shapes 610, 620, and 630 with its possible colorings using the same colors X, Y, and Z from FIG. 2b. Each of colorings 630, 635, 640, 645, 650, and 655 may be one to one mapped to any other coloring of that set 657. For example, coloring 630 may be one to one mapped to coloring 645 by mapping color X to X, Y to Z, and Z to Y. Similarly, each of colorings 660, 665, 670, 675, 680, and 685 may be one to one mapped to any other coloring of that set 690. However, no one to one mapping exists between colorings of these two sets 657 and 690. This is because shapes 610 and 630 have different colors in each coloring of the set 657, while they share the same color in each coloring of the set 690.

Cells with colorings that are not one to one mappable may be handled by characterizing quantities of interest for one coloring of each one to one mappable group. Alternatively, characterization may be done for only one coloring, restricting colorings of instances of the cell to those that are one to one mappable to the coloring chosen for characterization. In this instance, it may be desirable to characterize a coloring that minimizes sensitivity to variation.

For example, if a delay of interest for cell 600 is dependent on the total capacitance of shape 620 to all other shapes, and variation in alignment is the dominant cause of capacitance variation, it may be desirable to characterize the delay for coloring 660 or another coloring that is one to one mappable to it, because misalignment that would decrease the distance between shapes 610 and 620 (and thus increase the capacitance between them) would also increase the distance between shapes 620 and 630 (and thus decrease the capacitance between them). If, however, width variation is the dominant cause of capacitance variation, it may be desirable to characterize coloring 630 or another coloring that is one to one mappable to it, because widths of shapes 610 and 630 may vary independently, so the probability that both may widen or narrow and thereby increase or decrease the total capacitance of shape 620 is lower than in the instance of coloring 660, in which shapes 610 and 630 have the same color, and therefore have correlated width variation.

Figure 7:
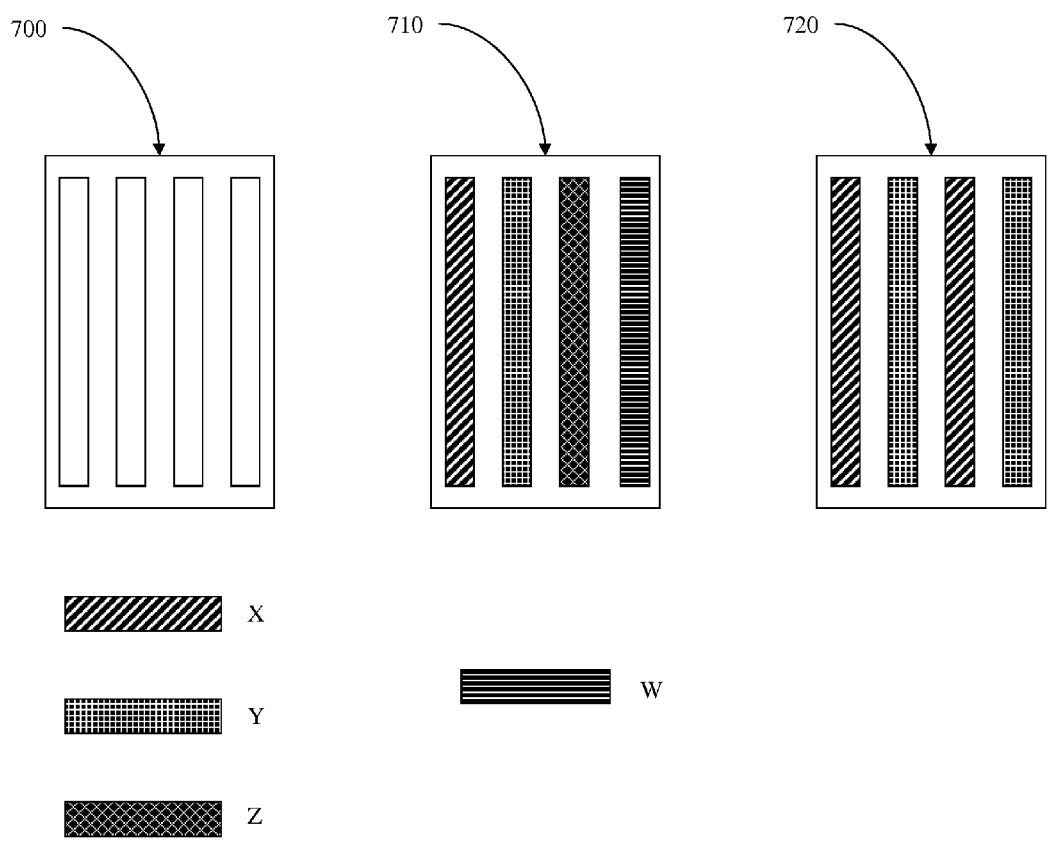

In embodiments, another method that can be used with cells having colorings that are not one to one mappable is to create a coloring, possibly using more than the original set of colors, that is many to one mappable to each possible coloring of the cell. Cell 700 in FIG. 7 can have a characterization coloring 710 using the colors X, Y, and Z of FIG. 2b, plus a fourth color W, that can be mapped to actual coloring 720 by mapping X to X, Y to Y, Z to X, and W to Y. Coloring 710 may similarly be many to one mapped to any other possible coloring of cell 700. For coloring 710 of cell 700, a characterized delay function (5) might be:

$$D_{710} = D_0 + D_1 \cdot p_{Xw} + D_2 \cdot p_{Xa} + D_3 \cdot p_{Yw} + D_4 \cdot p_{Ya} + D_5 \cdot p_{Zw} + D_6 \cdot p_{Za} + D_7 \cdot p_{Ww} + D_8 \cdot p_{Wa} + \quad (5)$$

When applied to instance coloring 720 this delay function (5) becomes function (6):

$$D_{120} = D_0 + (D_1 + D_5) \cdot p_{Xw} + (D_2 + D_6) \cdot p_{Xa} + (D_3 + D_7) \cdot p_{Yw} + (D_4 + D_8) \cdot p_{Ya} \quad (6)$$

In general the number of colors required to create a coloring that can be many to one mapped to any possible coloring of a cell may be large, and increasing the number of characterization colors increases the cost (runtime and storage) of characterization, so a limit on the number of characterization colors may be imposed, creating a similar limitation on the number of possible colorings that may be used for cell instances.

Flow Diagram

Figure 8:
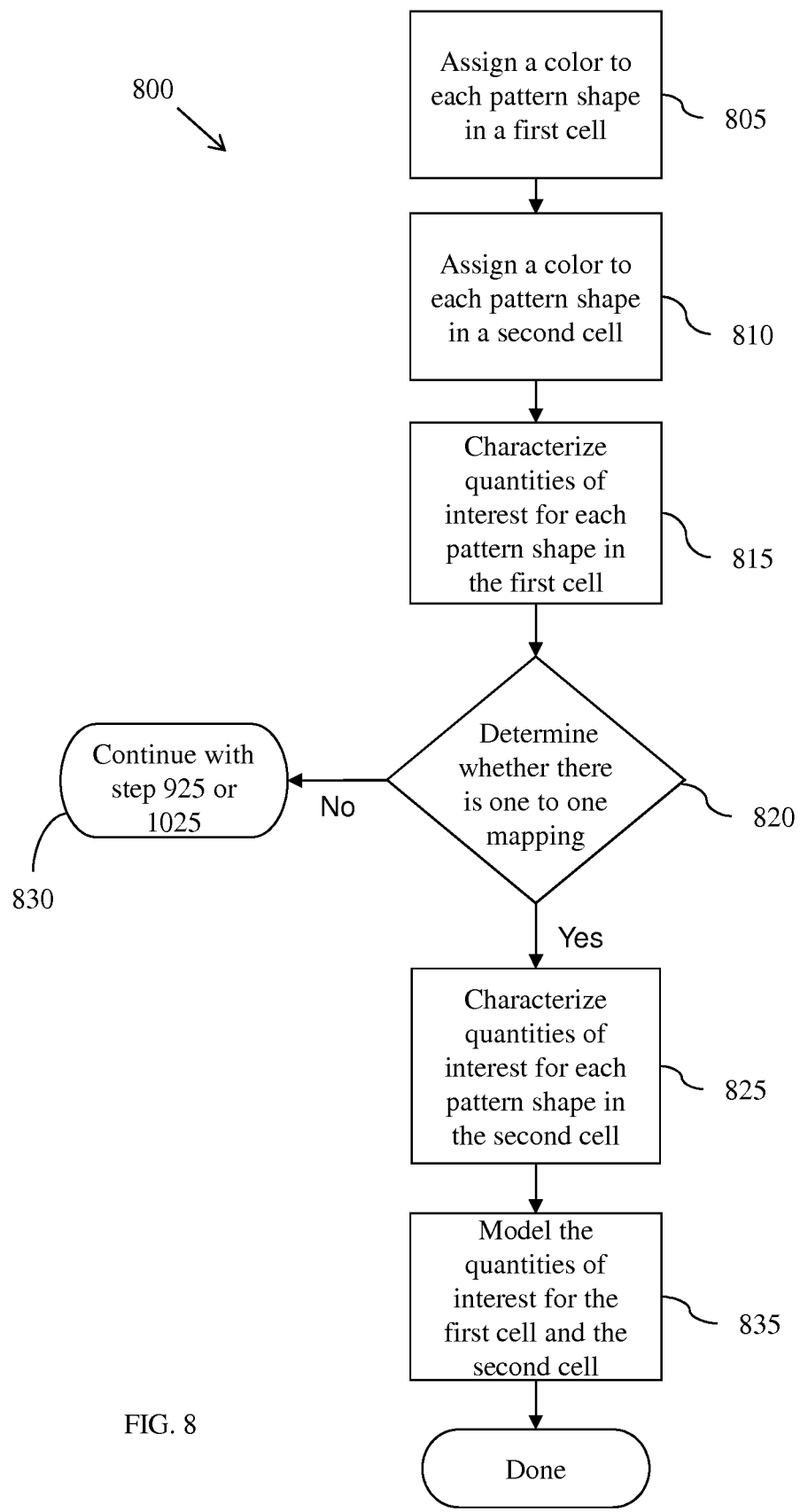
FIGS. 8-10 are illustrative process flows for implementing the system in accordance with aspects of the invention.
Figure 9:
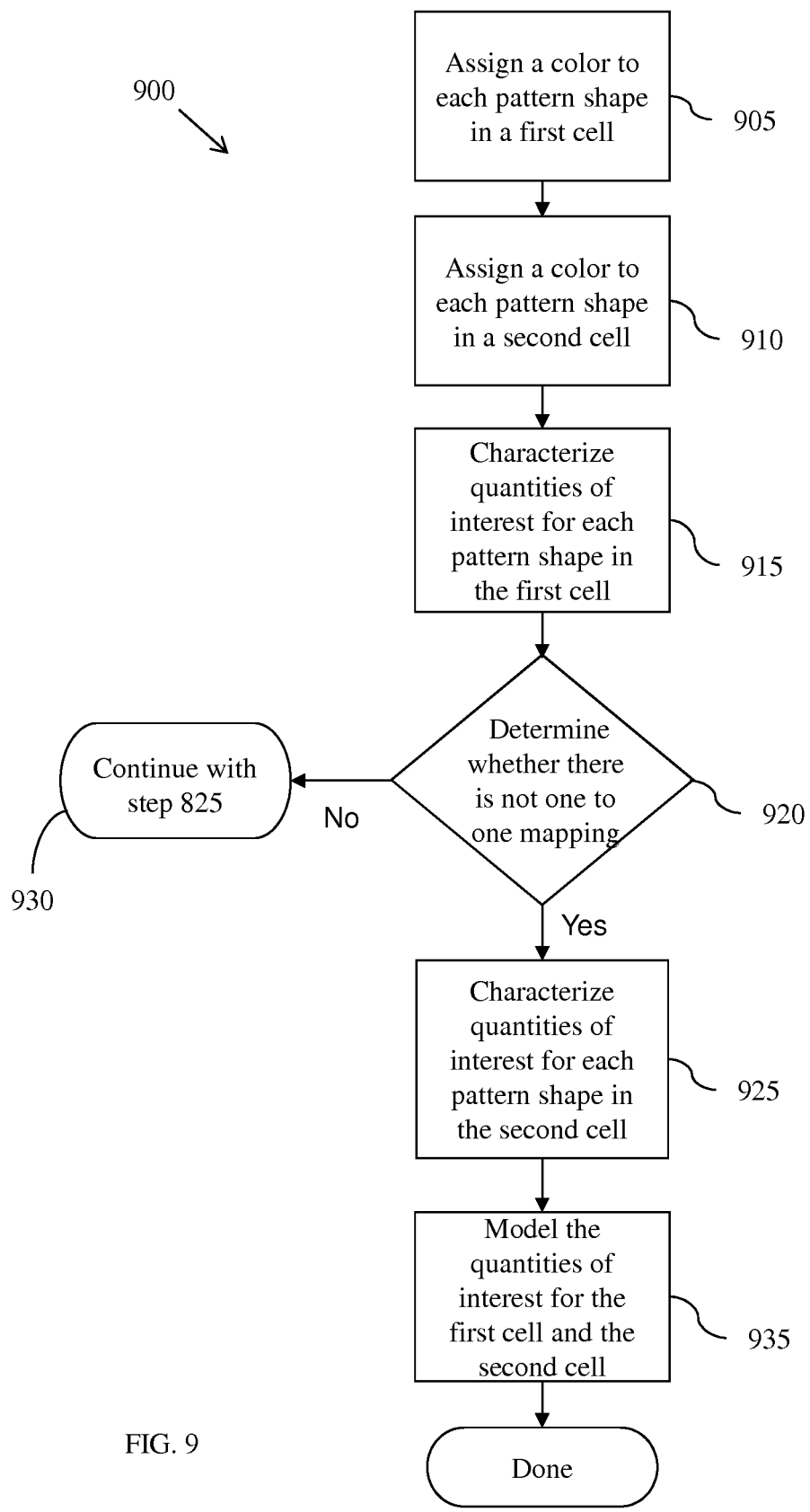
Figure 10:
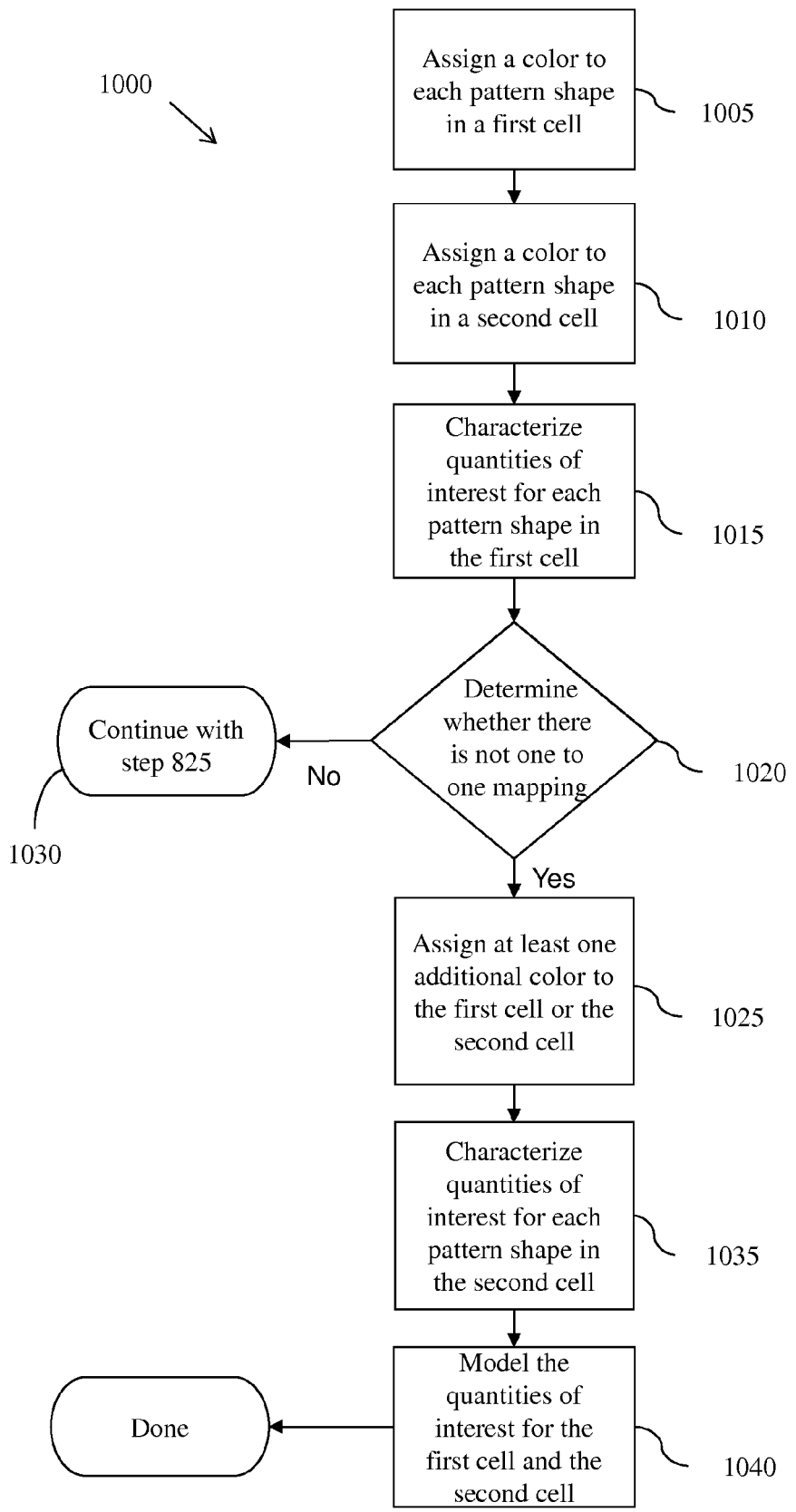

FIGS. 8-10 show exemplary flows for performing aspects of the present invention. The steps of FIGS. 8-10 may be implemented in the environment of FIG. 1, for example.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

Furthermore, the invention can take the form of a computer program product accessible from a computer-usable or computer-readable medium providing program code for use by or in connection with a computer or any instruction execution system. The software and/or computer program product can be implemented in the environment of FIG. 1. For the purposes of this description, a computer-usable or computer readable medium can be any apparatus that can contain, store, communicate, propagate, or transport the program for use by or in connection with the instruction execution system, apparatus, or device. The medium can be an electronic, magnetic, optical, electromagnetic, infrared, or semiconductor system (or apparatus or device) or a propagation medium. Examples of a computer-readable storage medium include a semiconductor or solid state memory, magnetic tape, a removable computer diskette, a random access memory (RAM), a read-only memory (ROM), a rigid magnetic disk and an optical disk. Current examples of optical disks include compact disk-read only memory (CD-ROM), compact disc-read/write (CD-R/W) and DVD.

In embodiments, as shown in FIG. 8, a process 800 is provided for hierarchical design of an integrated circuit design. It should be appreciated by those skilled in the art that although the following process are described for illustrative purpose with respect to only two cells, the processes described herein are applicable to any number of cells. At step 805, a color is assigned to each pattern shape in a first cell. For example, a different indicator capable of distinguishing one pattern from another pattern is assigned to each pattern shape in a first cell (as discussed with respect to FIGS. 2a and 2b). At step 810, a color is assigned to each pattern shape in a second cell (as discussed with respect to FIG. 4). For example, a color is assigned to each pattern shape in a second instance of the first cell or a completely different cell.

At step 815, quantities of interest are characterized for each pattern shape in the first cell. In accordance with aspects of the invention, quantities of interest (e.g., delay or slew) are characterized as a function of parameters associated with each pattern shape assigned to the different colors. The characterization may comprise assigning at least one set of parameters for each color assigned to each pattern shape in the first cell. For example, (as discussed above with respect to FIG. 4 and Function (1)) a first set of parameters $p_{Xw}$, $p_{Yw}$, and $p_{Zw}$ may be assigned respectively to colors X, Y, and Z, which represent the variation in the manufactured width of pattern shapes of the respective colors.

At step 820, there is a determination as to whether the colors assigned in the first cell are all one to one mappable to the colors assigned in the second cell. For example, there is a determination as to whether all pattern shapes of a color X in the assigned coloring for the first cell have a color Y in the assigned coloring for the second cell, all pattern shapes of the color Y in the coloring of the first cell have a color Z in the coloring of the second cell, and all shapes of the color Z in the coloring of the first cell have the color X in the coloring of the second cell (as discussed above with respect to FIG. 4).

At step 825, when the colors assigned in the first cell are all one to one mappable to the colors assigned in the second cell, the quantities of interest for each pattern shape in the second cell are characterized using the quantities of interest characterized for the first cell. The characterization may comprise using at least one second set of parameters mappable to the colors assigned in the second cells. For example, since the colors assigned in the first cell are all one to one mappable to the colors assigned in the second cell, the quantities of interest (e.g., delay or slew) for the second cell may be characterized using the same parameter values found in the characterization of the first cell.

At step 830, when the colors assigned in the first cell are all not one to one mappable to the colors assigned in the second cell, the process may continue at step 925 of process 900 or 1025 of process 1000, as discussed in further detail below.

At step 835, the quantities of interest for the first cell and the second cell are modeled. In embodiments, the EDA application (e.g., computation tool 100 as discussed above with respect to FIG. 1) may be configured to model the quantities of interest (e.g., the delay or slew) for each of the cells of an IC design using the characterizations provided for each pattern shape in the cells. For example, the EDA application may compute the quantities of interest for the first cell using the assigned first set of parameters with function (1) to take into account the variation caused by the multi-patterning within the first cell. The EDA application may compute the quantities of interest for the second cell using the assigned second set of parameters with function (2) to take into account the variation caused by the multi-patterning within the second cell. Further, the EDA application may compute the quantities of interest for a path that extends through the first cell and the second cell using the assigned first set of parameters and the second set of parameters with functions (3) and (4) to take into account the variation caused by the multi-patterning within the first cell and the second cell.

Advantageously, this process allows for simple models of the quantities of interest in the IC to be generated. Also advantageously, this process of using assigned colors and associated characterizations avoids restrictions on cell placement in the hierarchical design of the IC.

In embodiments, as shown in FIG. 9, a process 900 is provided for hierarchical design of an integrated circuit design. It should be appreciated by those skilled in the art that although the following processes are described for illustrative purpose with respect to only two cells, the processes described herein are applicable to any number of cells. At step 905, a color is assigned to each pattern shape in a first cell (as discussed with respect to FIG. 8). At step 910, a color is assigned to each pattern shape in a second cell (as discussed with respect to FIG. 8). At step 915, quantities of interest are characterized for each pattern shape in the first cell (as discussed with respect to FIG. 8).

At step 920, there is a determination as to whether the colors assigned in the first cell are not all one to one mappable to the colors assigned in the second cell. For example, there is a determination as to whether all pattern shapes of a color X in the assigned coloring for the first cell do not have a color Y in the assigned coloring for the second cell, all pattern shapes of the color Y in the coloring of the first cell do not have a color Z in the coloring of the second cell, or all shapes of the color Z in the coloring of the first cell do not have the color X in the coloring of the second cell (as discussed above with respect to FIG. 6).

At step 925, when the colors assigned in the first cell are not all one to one mappable to the colors assigned in the second cell, the quantities of interest for each pattern shape in the second cell are characterized using the quantities of interest determined for each one to one mappable group of cells. For example, hardware feedback could be used to determine a correlation, or a new delay function of a new set of parameters or a bounding delay function may be used in the model. In other words, one color may be modeled as a combination of colors. In an alternative embodiment, a placement/optimization tool, e.g., computation tool 100 as described with respect to FIG. 1, may be configured to replace the non-mappable cell with a new cell that is mappable. However, this may require new routing, etc. to allow for the new cell placement.

At step 930, when the colors assigned in the first cell are all one to one mappable to the colors assigned in the second cell, the process may continue at step 825 of process 800, as discussed in further detail above.

At step 935, the quantities of interest for the first cell and the second cell are modeled. For example, an EDA application (e.g., computation tool 100 as discussed above with respect to FIG. 1) may be configured to model the quantities of interest (e.g., the delay or slew) for each of the cells of an IC design using the characterizations provided for each pattern shape in the cells. Advantageously, this process allows for simple models of the quantities of interest in the IC to be generated. Also advantageously, this process of using assigned colors and associated characterizations avoids restrictions on cell placement in the hierarchical design of the IC.

In embodiments, as shown in FIG. 10, a process 1000 is provided for hierarchical design of an integrated circuit design. It should be appreciated by those skilled in the art that although the following process are described for illustrative purpose with respect to only two cells, the processes described herein are applicable to any number of cells. At step 1005, a color is assigned to each pattern shape in a first cell (as discussed with respect to FIG. 8). At step 1010, a color is assigned to each pattern shape in a second cell (as discussed with respect to FIG. 8). At step 1015, quantities of interest are characterized for each pattern shape in the first cell (as discussed with respect to FIG. 8). At step 1020, there is a determination as to whether the colors assigned in the first cell are not all one to one mappable to the colors assigned in the second cell (as discussed with respect to FIG. 9).

At step 1025, when the colors assigned in the first cell are not all one to one mappable to the colors assigned in the second cell, a coloring of the first cell and the second cell is created by assigning at least one additional color to the first cell or the second cell. The at least one additional color is different from the colors originally assigned to the first cell and the second cell. In embodiments, the coloring of the first cell and the second cell is created such that each of the colors assigned to the first cell are one to one mappable or many to one mappable with the colors assigned to the second cell. For example, the first cell can have a characterization coloring using the colors X, Y, and Z, plus a fourth color W, that can be mapped to coloring of the second cell by mapping X to X, Y, to Y, Z to X, and W to Y (as discussed above with respect to FIG. 7).

At step 1030, when the colors assigned in the first cell are all one to one mappable to the colors assigned in the second cell, the process may continue at step 825 of process 800, as discussed in further detail above.

At step 1035, the quantities of interest for each pattern shape in the second cell are characterized using the quantities of interest determined for each one to one mappable group of cells. For example, hardware feedback could be used to determine a correlation, or a new delay function of a new set of parameters or a bounding delay function may be used in the model. In other words, one color may be modeled as a combination of colors. In an alternative embodiment, a placement/optimization tool, e.g., computation tool 100 as described with respect to FIG. 1, may be configured to replace the non-mappable cell with a new cell that is mappable. However, this may require new routing, etc. to allow for the new cell placement.

At step 1040, the quantities of interest for the first cell and the second cell are modeled. For example, an EDA application (e.g., computation tool 100 as discussed above with respect to FIG. 1) may be configured to model the quantities of interest (e.g., the delay or slew) for each of the cells of an IC design using the characterizations provided for each pattern shape in the cells. Advantageously, this process allows for simple models of the quantities of interest in the IC to be generated. Also advantageously, this process of using assigned colors and associated characterizations avoids restrictions on cell placement in the hierarchical design of the IC.

Figure 11:
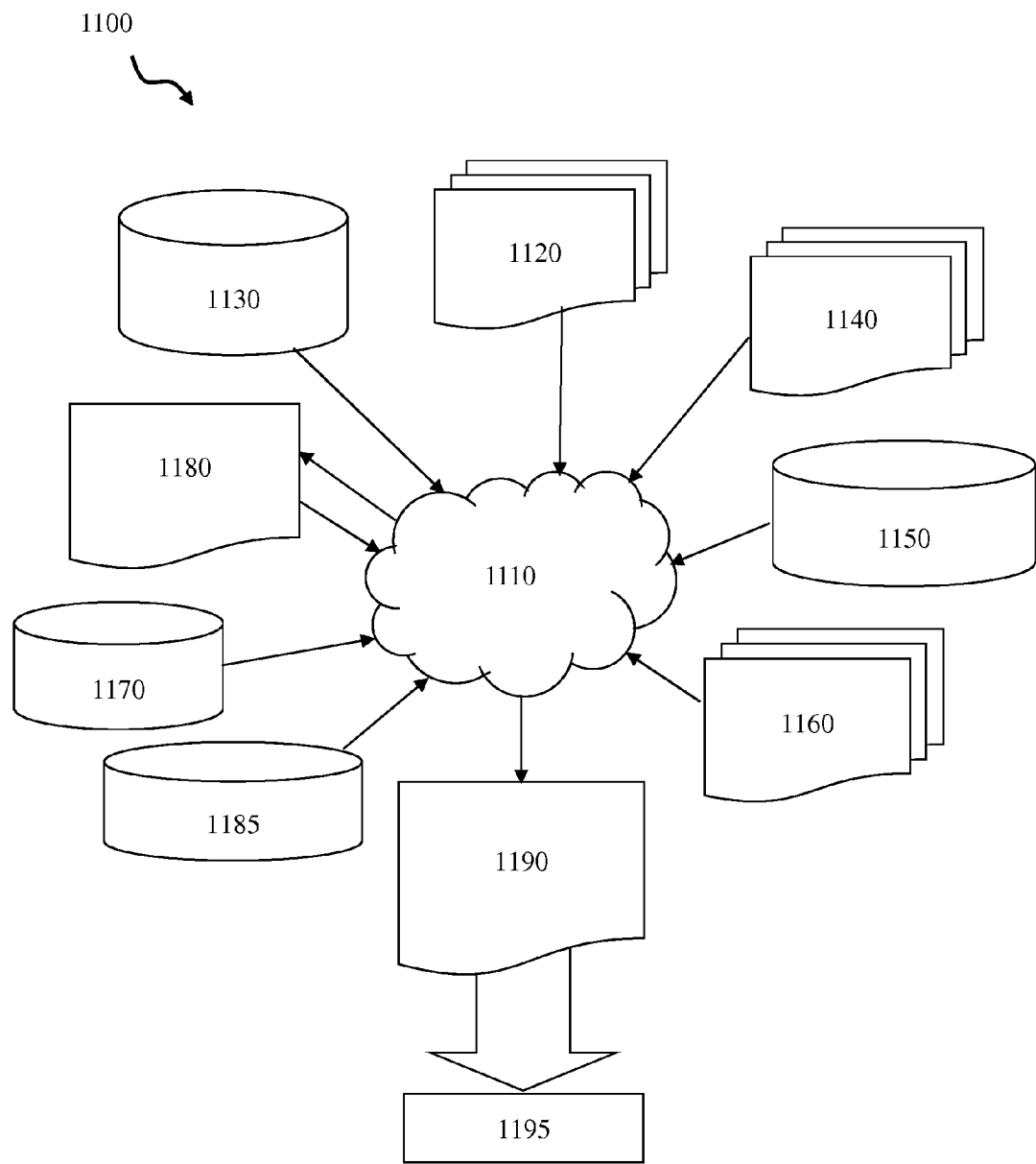
FIG. 11 is a flow diagram of a design process used in semiconductor design, manufacture, and/or test.

FIG. 11 is a flow diagram of a design process used in semiconductor design, manufacture, and/or test used with the system and method of the present invention. FIG. 11 shows a block diagram of an exemplary design flow 1100 used for example, in semiconductor IC logic design, simulation, test, layout, and manufacture. Design flow 1100 includes processes, machines and/or mechanisms for processing design structures or devices to generate logically or otherwise functionally equivalent representations of the design structures and/or devices. The design structures processed and/or generated by design flow 1100 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 1100 may vary depending on the type of representation being designed. For example, a design flow 1100 for building an application specific IC (ASIC) may differ from a design flow 1100 for designing a standard component or from a design flow 1100 for instantiating the design into a programmable array, for example a programmable gate array (PGA) or a field programmable gate array (FPGA) offered by Altera® Inc. or Xilinx® Inc.

FIG. 11 illustrates multiple such design structures including an input design structure 1120 that is preferably processed by a design process 1110. Design structure 1120 may be a logical simulation design structure generated and processed by design process 1110 to produce a logically equivalent functional representation of a hardware device. Design structure 1120 may also or alternatively comprise data and/or program instructions that when processed by design process 1110, generate a functional representation of the physical structure of a hardware device. Whether representing functional and/or structural design features, design structure 1120 may be generated using electronic computer-aided design (ECAD) such as implemented by a core developer/designer. When encoded on a machine-readable data transmission, gate array, or storage medium, design structure 1120 may be accessed and processed by one or more hardware and/or software modules within design process 1110 to simulate or otherwise functionally represent an electronic component, circuit, electronic or logic module, apparatus, device, or system, which can be implemented with the method and system of the present invention. As such, design structure 1120 may comprise files or other data structures including human and/or machine-readable source code, compiled structures, and computer-executable code structures that when processed by a design or simulation data processing system functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 1110 preferably employs and incorporates hardware and/or software modules for synthesizing, translating, or otherwise processing a design/simulation functional equivalent of the components, circuits, devices, or logic structures to generate a netlist 1180 which may contain design structures such as design structure 1120. Netlist 1180 may comprise, for example, compiled or otherwise processed data structures representing a list of wires, discrete components, logic gates, control circuits, I/O devices, models, etc. that describes the connections to other elements and circuits in an integrated circuit design. Netlist 1180 may be synthesized using an iterative process in which netlist 1180 is resynthesized one or more times depending on design specifications and parameters for the device. As with other design structure types described herein, netlist 1180 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 1110 may include hardware and software modules for processing a variety of input data structure types including netlist 1180. Such data structure types may reside, for example, within library elements 1130 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 1140, characterization data 1150, verification data 1160, design rules 1170, and test data files 1185 that may include input test patterns, output test results, and other testing information. Design process 1110 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 1110 without deviating from the scope and spirit of the invention. Design process 1110 may also include modules for performing standard circuit design processes such as timing analysis, verification, design rule checking, place and route operations, etc.

Design process 1110 employs and incorporates logic and physical design tools such as HDL compilers and simulation model build tools to process design structure 1120 together with some or all of the depicted supporting data structures along with any additional mechanical design or data (if applicable), to generate a second design structure 1190.

Design structure 1190 resides on a storage medium or programmable gate array in a data format used for the exchange of data of mechanical devices and structures (e.g. information stored in an IGES, DXF, Parasolid XT, JT, DRG, or any other suitable format for storing or rendering such mechanical design structures). Similar to design structure 1120, design structure 1190 preferably comprises one or more files, data structures, or other computer-encoded data or instructions that reside on transmission or data storage media and that when processed by an ECAD system generate a logically or otherwise functionally equivalent form of one or more devices. In one embodiment, design structure 1190 may comprise a compiled, executable HDL simulation model that functionally simulates the devices.

Design structure 1190 may also employ a data format used for the exchange of layout data of integrated circuits and/or symbolic data format (e.g. information stored in a GDSII (GDS2), GL1, OASIS, map files, or any other suitable format for storing such design data structures). Design structure 1190 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure. Design structure 1190 may then proceed to a stage 1195 where, for example, design structure 1190: proceeds to tape-out, is released to manufacturing, is released to a mask house, is sent to another design house, is sent back to the customer, etc.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A method for hierarchical design of an integrated circuit design for an integrated circuit including transistors, the method comprising:
    assigning a color to each pattern shape in a first cell of the integrated circuit design;
    assigning a color to each pattern shape in a second cell of the integrated circuit design;
    characterizing quantities of interest, including at least one of delay and slew, for each pattern shape in the first cell;
    determining that the colors assigned in the first cell are not all one to one mappable to the colors assigned in the second cell;
    characterizing quantities of interest, including at least one of delay and slew, for each pattern shape in the second cell using the quantities of interest determined for each one to one mappable group; and
    modeling the quantities of interest for the first cell and the second cell using a processor,
    wherein at least the step of modeling the quantities of interest is performed using at least one processor.

2. The method of claim 1, wherein the first cell and the second cell represent at least a first component and a second component of an integrated circuit design respectively.

3. The method of claim 2, wherein the first cell and the second cell are designed for reuse in different integrated circuit designs.

4. The method of claim 1, wherein the characterizing the quantities of interest for each pattern shape in the first cell comprises assigning at least one set of parameters for each color assigned to each pattern shape in the first cell.

5. The method of claim 4, wherein the at least one first set of parameters represent variation in manufacture of each pattern shape in the first cell.

6. The method of claim 5, the characterizing the quantities of interest for each pattern shape in the second cell comprises using at least one second set of parameters mappable to the colors assigned in the second cell.

7. The method of claim 6, wherein the at least one second set of parameters represent variation in manufacture of each pattern shape in the second cell.

8. The method of claim 7, wherein the modeling the quantities of interest comprises modeling the quantities of interest for the first cell and the second cell as a function of the at least one first set of parameters and the at least one second set of parameters respectively.

9. The method of claim 8, wherein the modeling the quantities of interest further comprises modeling the quantities of interest for a path that extends through the first cell and the second cell using the first set of parameters and the second set of parameters.

10. The method of claim 1, wherein the quantities of interest for each pattern shape in the first cell are characterized as a function of at least one first set of parameters associated with each pattern shape in the first cell.

11. The method of claim 10, wherein the quantities of interest for each pattern shape in the second cell are characterized as a function of at least one second set of parameters associated with each pattern shape in the second cell.

12. The method of claim 1, further comprising replacing a non-mappable second cell with a new second cell that is mappable.

13. The method of claim 1, wherein the colors assigned to the first cell and the second cell are modeled as a combination of colors.

* * * * *